United States Patent
Kataoka

(10) Patent No.: US 9,964,283 B2
(45) Date of Patent: May 8, 2018

(54) LED MODULE HAVING A LENS WITH A HOLLOW AND LIGHT FIXTURE WITH THE SAME

(71) Applicant: PANASONIC INTELLECTUAL PROPERTY MANAGEMENT CO., LTD., Osaka (JP)

(72) Inventor: Takaaki Kataoka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days. days.

(21) Appl. No.: 15/248,786

(22) Filed: Aug. 26, 2016

(65) Prior Publication Data

US 2017/0059120 A1 Mar. 2, 2017

(30) Foreign Application Priority Data

Aug. 28, 2015 (JP) ................. 2015-169454

(51) Int. Cl.
*F21V 8/00* (2006.01)
*F21V 5/04* (2006.01)
(Continued)

(52) U.S. Cl.
CPC ............... *F21V 5/04* (2013.01); *F21S 8/026* (2013.01); *F21V 5/045* (2013.01); *F21V 7/0091* (2013.01); *F21V 23/005* (2013.01); *F21V 23/008* (2013.01); *F21V 23/02* (2013.01); *F21V 29/74* (2015.01); *H01L 25/0753* (2013.01); *H01L 33/502* (2013.01); *H01L 33/56* (2013.01); *H01L 33/58* (2013.01);

*H01L 33/62* (2013.01); *F21Y 2113/10* (2016.08); *F21Y 2113/13* (2016.08); *F21Y 2115/10* (2016.08)

(58) Field of Classification Search
CPC ........ F21V 5/04; F21V 23/008; F21V 7/0091; H01L 33/62; F21Y 2113/13; F21Y 2113/10; F21Y 2115/10
See application file for complete search history.

(56) References Cited

U.S. PATENT DOCUMENTS 8,651,694 B2 * 2/2014 Becker ................... F21V 14/06
362/242
8,992,053 B2 * 3/2015 Pelka ....................... F21V 5/04
362/311.02
(Continued)

FOREIGN PATENT DOCUMENTS

JP 2010-282841 A 12/2010
JP 2012-501068 A 1/2012
(Continued)

*Primary Examiner* — Tracie Y Green
(74) *Attorney, Agent, or Firm* — McDermott Will & Emery LLP

(57) ABSTRACT

An LED module includes a circuit substrate, a light source and a lens. The light source includes first and second LEDs that differ in chromaticity. The circuit substrate is provided with conductors for driving the first and second LEDs independently. The lens includes a hollow, on a side of the circuit substrate, inside which the light source is present. An inside of the hollow is a light entrance surface. An opening of the hollow has a circular shape. The first and second LEDs of the light source are arranged to have point symmetry.

9 Claims, 8 Drawing Sheets

(51) Int. Cl.

| | | |
|---|---|---|
| *F21V 29/74* | (2015.01) | |
| *F21S 8/02* | (2006.01) | |
| *F21V 23/00* | (2015.01) | |
| *F21V 23/02* | (2006.01) | |
| *H01L 25/075* | (2006.01) | |
| *H01L 33/50* | (2010.01) | |
| *H01L 33/56* | (2010.01) | |
| *H01L 33/58* | (2010.01) | |
| *H01L 33/62* | (2010.01) | |
| *F21V 7/00* | (2006.01) | |
| F21Y 113/10 | (2016.01) | |
| F21Y 115/10 | (2016.01) | |
| F21Y 113/13 | (2016.01) | |

(56) References Cited

U.S. PATENT DOCUMENTS

| | | | | |
|---|---|---|---|---|
| 9,070,850 | B2 * | 6/2015 | Keller | H01L 33/62 |
| 2008/0111143 | A1 * | 5/2008 | Ishida | F21S 48/10 |
| | | | | 257/95 |
| 2011/0182085 | A1 * | 7/2011 | Ko | F21K 9/00 |
| | | | | 362/612 |
| 2011/0210349 | A1 | 9/2011 | Pan | |
| 2014/0268808 | A1 * | 9/2014 | Negley | F21V 7/22 |
| | | | | 362/307 |
| 2014/0293614 | A1 * | 10/2014 | Wang He | F21V 5/04 |
| | | | | 362/311.02 |
| 2014/0301071 | A1 * | 10/2014 | Jorgensen | F21V 14/06 |
| | | | | 362/231 |
| 2015/0198760 | A1 * | 7/2015 | Wilcox | G02B 6/0038 |
| | | | | 362/606 |
| 2015/0348948 | A1 * | 12/2015 | Andrews | H01L 25/0753 |
| | | | | 257/89 |
| 2017/0038051 | A1 * | 2/2017 | Fukasawa | F21V 29/503 |

FOREIGN PATENT DOCUMENTS

| | | |
|---|---|---|
| JP | 2012-043544 A | 3/2012 |
| JP | 2012-174867 A | 9/2012 |
| JP | 2014-502029 A | 1/2014 |
| WO | 2012/085735 A2 | 6/2012 |

* cited by examiner

LED MODULE HAVING A LENS WITH A HOLLOW AND LIGHT FIXTURE WITH THE SAME

CROSS REFERENCE TO RELATED APPLICATIONS

This application claims the benefit and priority of Japanese Patent Application No. 2015-169454, filed on Aug. 28, 2015, the entire contents of which are incorporated herein by reference.

TECHNICAL FIELD

This disclosure relates to an LED (Light Emitting Diode) module and a light fixture with the same.

BACKGROUND ART

There has been proposed a conventional light emitting device as an LED module, which includes: a substrate; first and second LEDs that are mounted on the substrate and configured to emit respective light of different chromaticity; and lenses for mixing the respective light of the first and second LEDs (JP 2012-174867 A (hereinafter referred to as "Document 1")).

The first LEDs are solid light emitting elements configured to emit white light. The second LEDs are solid light emitting elements configured to emit light bulb color (incandescent color) light.

The lenses are disposed on the substrate and each covers adjoining first and second LEDs. Each lens has a lens body that is shaped like an inverted truncated cone. Two hemispherical hollows are formed in the lens body and individually cover first and second LEDs.

A light fixture with the light emitting device has also been proposed in Document 1.

In the field of LED modules and light fixtures with the same, what is needed is to suppress irregular colors.

SUMMARY

It is an object of the present disclosure to provide: an LED module including first and second LEDs that differ in chromaticity, which is capable of suppressing irregular colors thereof when respective light from the first and second LEDs is mixed; and a light fixture with the same.

An LED module according to one aspect includes a circuit substrate, a light source and a lens. The light source includes first and second LEDs that differ in chromaticity. The light source is provided on a surface of the circuit substrate. The lens is disposed on a side of the surface of the circuit substrate and configured to control distribution of light from the light source. The lens includes a hollow, on a side of the circuit substrate, inside which the light source is present. The circuit substrate is provided with conductors for driving the first and second LEDs independently. An inside of the hollow is a light entrance surface. An opening of the hollow has a circular shape. The first and second LEDs of the light source are point-symmetrically arranged with respect to a center of a plane. The plane is perpendicular to an optical axis of the lens. The center is an intersection of the optical axis and the plane.

A light fixture according to another aspect includes the LED module, and a fixture body that retains the LED module.

BRIEF DESCRIPTION OF THE DRAWINGS

The figures depict one or more implementations in accordance with the present teaching, by way of example only, not by way of limitations. In the figure, like reference numerals refer to the same or similar elements where.

DETAILED DESCRIPTION

Each figure in Embodiments 1 and 2 is a schematic diagram, and does not necessarily show that dimensional ratios of components therein correspond to actual dimensional ratios.

Embodiment 1

An LED module 1a of the embodiment will be hereinafter explained with reference to FIGS. 1A to 4.

Figure 1A:
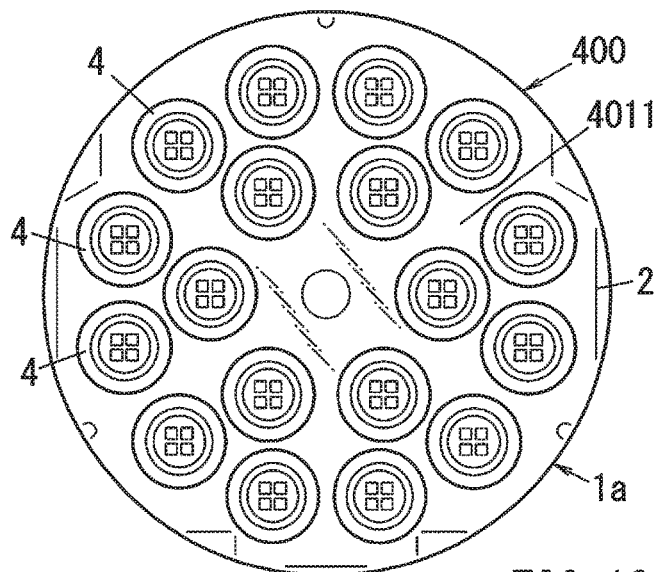
FIG. 1A is a schematic plan view of an LED module in accordance with Embodiment 1.
Figure 1B:
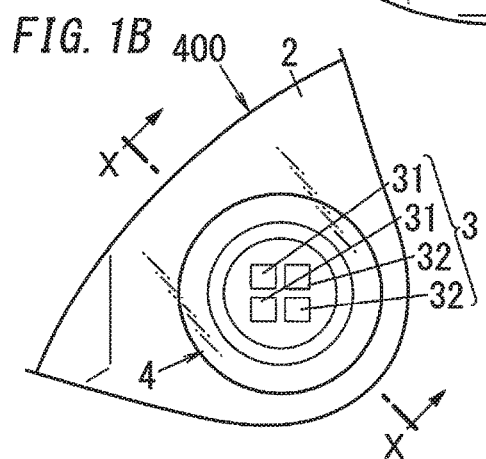
FIG. 1B is an enlarged view of part of FIG. 1A.
Figure 1C:
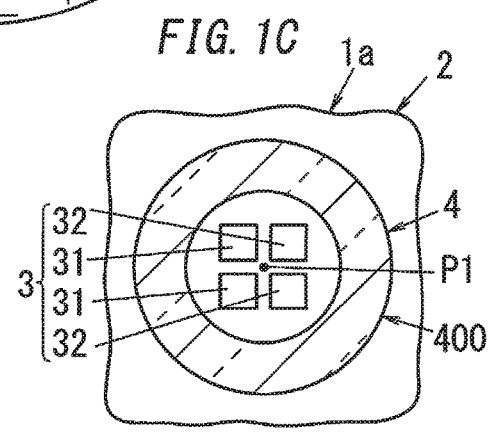
FIG. 1C is a cross sectional view of FIG. 1B.
Figure 1D:
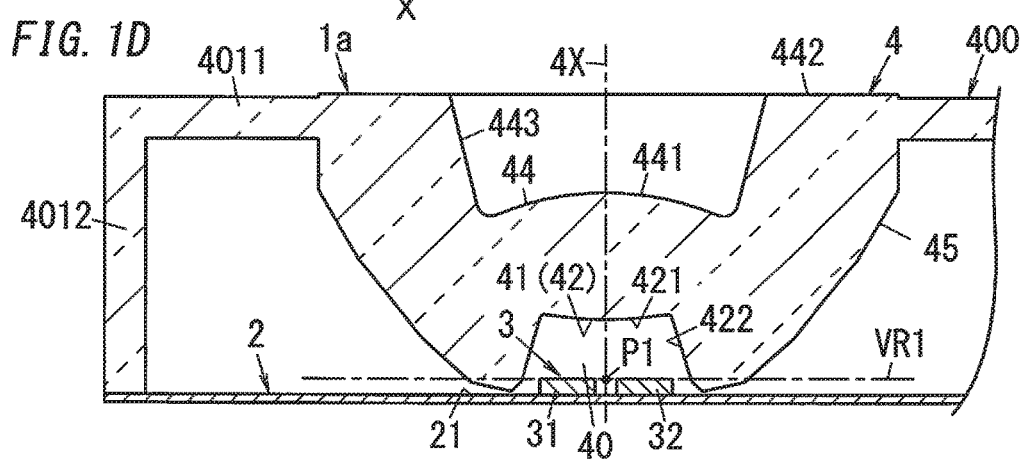
FIG. 1D is a sectional view taken along an X-X line in FIG. 1B.

The LED module 1a includes: a circuit substrate 2; a light source 3 disposed on a surface 21 of the circuit substrate 2; and a lens 4 that is disposed on a side of the surface 21 of the circuit substrate 2 and configured to control distribution of light from the light source 3. In the example of FIG. 1C, the light source 3 includes first LEDs 31 and second LEDs 32, which differ in chromaticity, but the light source 3 of the embodiment may include a first LED 31 and a second LED 32 which differ in chromaticity. In short, the light source 3 of the embodiment includes first and second LEDs 31 and 32 that differ in chromaticity. The circuit substrate 2 is formed with conductors (electric conductors or a conductive pattern) 23 for independently driving the first and second LEDs 31 and 32 (see FIG. 4). The lens 4 (lens body) includes a hollow 40, on a side of the circuit substrate 2, inside which the light source 3 is present, as shown in FIG. 1D. In the example of FIG. 1D, the lens body is part of a lens member 400 except for a front plate part 4011 and a side plate part 4012. For example, the lens body may be disposed on the side of the surface 21 of the circuit substrate 2 through another member corresponding to the front plate part 4011 and the side plate part 4012. An inside 41 of the hollow 40 of the lens 4 is a light entrance surface 42. In the example of FIG. 1C, an opening of the hollow 40 has a shape of a circle, but may be shaped like a circle. In short, the opening of the hollow 40 in the embodiment has a circular shape. The first and second LEDs 31 and 32 of the light source 3 are arranged to have point symmetry, as shown in FIGS. 1B and 1C.

With the configuration, the LED module 1*a* can suppress irregular colors thereof when respective light from first and second LEDs 31 and 32 that differ in chromaticity is mixed. In this case, the first and second LEDs 31 and 32 of the light source 3 are arranged around a center P1 of a plane VR1 to have point symmetry. The plane VR1 is perpendicular to an optical axis 4X of the lens 4. The center P1 is an intersection of the optical axis 4X and the plane VR1. That is, the first and second LEDs 31 and 32 of the light source 3 are point-symmetrically arranged with respect to the center P1 of the plane VR1. In the LED module 1*a*, since the conductors 23 are provided for independently driving the first and second LEDs 31 and 32, it is possible to separately adjust both optical outputs of the first and second LEDs 31 and 32. In short, the color of the LED module 1*a* can be adjusted.

Components of the LED module 1*a* will be hereinafter explained in detail.

As stated above, the LED module 1*a* includes a circuit substrate 2, light sources 3 and lenses 4.

The circuit substrate 2 is shaped like a circle in planar view, but is not limited to this. Here, the planar view of the circuit substrate 2 is defined as a peripheral shape of the circuit substrate 2 seen along a thickness direction of the circuit substrate 2. The circuit substrate 2 is formed of, for example a printed-circuit board. Preferably, the printed-circuit board has high thermal conductivity. For example, the printed-circuit board is formed of a glass fabric/glass nonwoven fabric base material epoxy resin copper clad laminate in conformity with the CEM-3 (Composite Epoxy Materials-3) standard.

Figure 2:
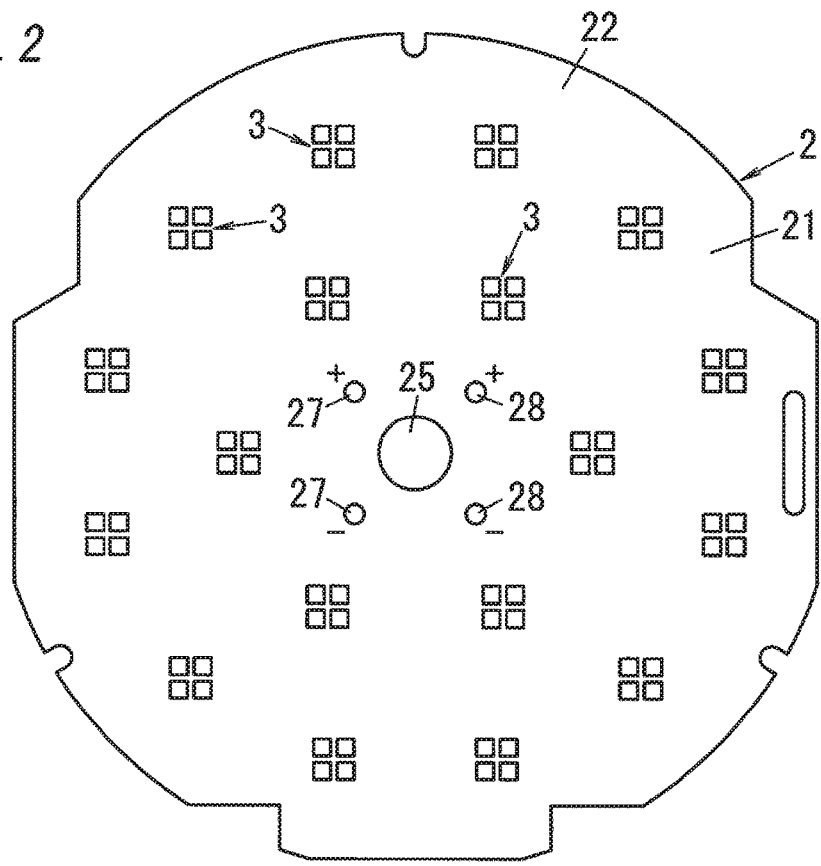
FIG. 2 is a schematic plan view of part of the LED module.
Figure 4:
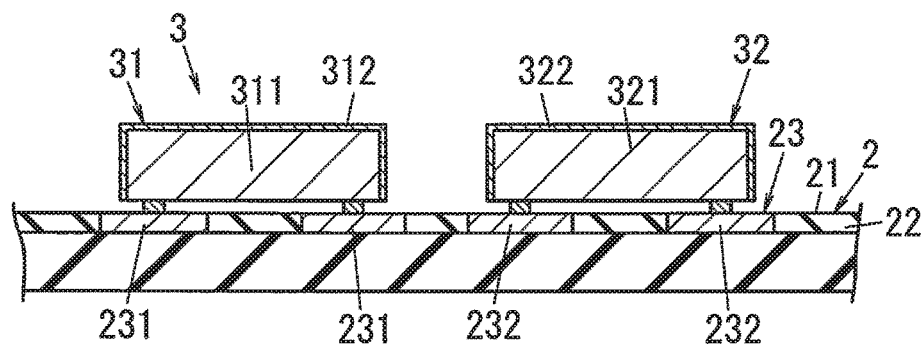
FIG. 4 is an enlarged view of part of FIG. 1D.

Preferably, as shown in FIGS. 2 and 4, the circuit substrate 2 includes a white resist layer (e.g., a white solder resist layer) 22 configured to reflect respective light from the light sources 3. In case the circuit substrate 2 includes the white resist layer 22, a surface of the white resist layer 22 forms part of the surface 21 of the circuit substrate 2. The LED module 1*a* can accordingly suppress optical absorption in the circuit substrate 2 and increase the optical output thereof. Preferably, material of the white resist layer 22 is selected from the group consisting of a white resist of fluorine resin, a white resist of epoxy resin and a white resist of silicone resin, for example.

Figure 3:
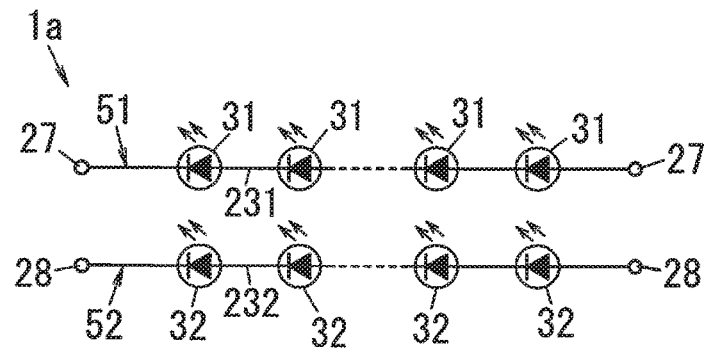
FIG. 3 is a circuit diagram of the LED module.

In the LED module 1*a* of the embodiment, the light sources (e.g., eighteen light sources) 3 are provided on the surface 21 of the circuit substrate 2. As shown in FIG. 3, the LED module 1*a* includes a first series circuit 51 formed of first LEDs (e.g., thirty six first LEDs) 31 connected in series, and a second series circuit 52 formed of second LEDs (e.g., thirty six second LEDs) 32 connected in series. Conductors 23 (see FIG. 4) of the circuit substrate 2 includes first conductors 231 for the first series circuit 51 and second conductors 232 for the second series circuit 52. The conductors 23 are formed of an electrically conductive layer. The electrically conductive layer is formed of, for example copper foil or other suitable metal material. The circuit substrate 2 also includes two first terminals 27 for supplying power to the first series circuit 51, and two second terminals 28 for supplying power to the second series circuit 52. Each of the first and second terminals 27 and 28 is formed of the electrically conductive layer like the conductors 23. The circuit substrate 2 is also formed in a center thereof with a wire insertion hole 25. The wire insertion hole is a hole that allows two first wires electrically connected one-to-one with the two first terminals 27 and two second wires electrically connected one-to-one with the two second terminals 28 to be inserted into. The LED module 1*a* is configured to allow the (thirty six) first LEDs 31 to emit light by electricity supplied between the two first terminals 27 from, e.g. an external power unit (power supply) 11 or the like. The LED module 1*a* is also configured to allow the (thirty six) second LEDs 32 to emit light by electricity supplied between the two second terminals 28 from the external power unit 11 or the like.

Preferably, each of first and second LEDs 31 and 32 included in each light source 3 may have a shape of a square, but be shaped like a square in planar view. In short, each of the first and second LEDs 31 and 32 has a square shape. In this case, it is preferable that each of the first and second LEDs 31 and 32 have an identical plane size. Preferably, each light source 3 includes first and second LEDs 31 and 32 two each. The LED module 1*a* can accordingly suppress irregular colors thereof in comparison with the case where each light source 3 includes first and second LEDs 31 and 32 one each. The LED module 1*a* can also increase an optical output thereof in comparison with the case where each light source 3 includes first and second LEDs 31 and 32 one each. Here, the shape of the first and second LEDs 31 and 32 in planar view is defined as a peripheral shape of the first and second LEDs 31 and 32 seen along the thickness direction of the circuit substrate 2.

Preferably, each color (light source color) of the first and second LEDs 31 and 32 is set based on correlated color temperature as an LED color defined by, for example JIS Z9112:2012. In JIS Z9112:2012, the LED color is classified into five types of daylight (D) color, neutral white (N) color, white (W) color, warm white (WW) color and light bulb (L) color (incandescent color) based on XYZ color space chromaticity. In the LED module 1*a* of the embodiment, it is preferable that each color of the first LEDs 31 be a white color and that each color of the second LEDs 32 be a light bulb color. The LED module 1*a* can accordingly adjust each color of the light sources 3 between the light bulb color and the white color. In other words, the LED module 1*a* can vary correlated color temperature of each light source 3 between correlated color temperature of each first LED 31 and correlated color temperature of each second LED 32. As an example, correlated color temperature of each first LED 31 is set to about 4300K. As an example, correlated color temperature of each second LED 32 is set to about 2700K.

Preferably, each of the first and second LEDs 31 and 32 is a chip size package LED. Such a chip size package LED enables reducing each mount area of the first and second LEDs 31 and 32 in comparison with the case where each of the first and second LEDs 31 and 32 is a surface-mount LED (a surface-mount type LED). The chip size package LED means an LED having a plane size that is the same as or slightly larger than a plane size of an LED chip (a chip size). In case the plane size is slightly larger than a chip size of an LED chip, the chip size package LED has a package that covers a surface and sides of the LED chip and is made from resin or the like. The surface of the LED chip is a surface including at least part of a light extraction surface of the LED chip and is on the opposite side to the side of the circuit substrate 2 in the LED chip with the chip size package LED mounted on the circuit substrate 2.

As shown in the example of FIG. 4, each first LED 31 includes a first LED chip 311 and a first wavelength conversion member 312. A chip size package LED forming the first LED 31 has the first wavelength conversion member 312 as a package.

Each first LED chip 311 is, for example an LED chip configured to emit blue light. Blue light from each first LED chip 311 has emission spectrum, a peak wavelength of which is contained in the wavelength region of 440 nm to 480 nm. Preferably, each first LED chip 311 is shaped like, e.g. a square in planar view. Here, the shape of each first LED chip 311 in planar view is defined as a peripheral shape thereof seen along the thickness direction of the circuit substrate 2.

Preferably, each first wavelength conversion member 312 is composed of a mixture of first phosphor particles and optically-transparent material. Preferably, the optically-transparent material is material with high transmittance with respect to visible light. The optically-transparent material is silicone resin, for example. It is accordingly possible to improve heat resistance and weather resistance of each first wavelength conversion member 312 in the LED module 1a. For example, the silicone resin means not only silicone resin but also silicone-modified resin or the like. Each first wavelength conversion member 312 includes the above first phosphor particles as first wavelength conversion material for wavelength converting part of light from a corresponding first LED chip 311 to emit light containing a different wavelength. For example, the first phosphor particles are first yellow phosphor particles for emitting yellow light.

As shown in the example of FIG. 4, each second LED 32 includes a second LED chip 321 and a second wavelength conversion member 322. A chip size package LED forming the second LED 32 has the second wavelength conversion member 322 as a package.

Each second LED chip 321 is, for example an LED chip configured to emit blue light. Blue light from each second LED chip 321 has emission spectrum, a peak wavelength of which is contained in the wavelength region of 440 nm to 480 nm. Preferably, each second LED chip 321 is shaped like, e.g. a square in planar view. Here, the shape of each second LED chip 321 in planar view is defined as a peripheral shape thereof seen along the thickness direction of the circuit substrate 2.

Preferably, each second wavelength conversion member 322 is composed of a mixture of second phosphor particles and optically-transparent material. Preferably, the optically-transparent material is material with high transmittance with respect to visible light. The optically-transparent material is silicone resin, for example. It is accordingly possible to improve heat resistance and weather resistance of each second wavelength conversion member 322 in the LED module 1a. Each second wavelength conversion member 322 includes the above second phosphor particles as second wavelength conversion material for wavelength converting part of light from a corresponding second LED chip 321 to emit light containing a different wavelength. For example, the second phosphor particles are second yellow phosphor particles for emitting yellow light.

For example, in each light source 3, first and second LED chips 311 and 312 have identical specifications, and first and second LEDs 31 and 32 differ in color temperature by different types (composition) of first and second phosphor particles. The identical specifications mean having an identical emission peak wavelength, an identical structure, an identical forward voltage (Vf) and an identical luminous flux. First and second LEDs 31 and 32 in each light source 3 may differ in color temperature by first and second phosphor particles which are each formed of identical phosphor particles and differ in concentration. Alternatively, in case first and second phosphor particles are each formed of identical phosphor particles, first and second LEDs 31 and 32 in each light source 3 may differ in color temperature by first and second LED chips 311 and 312 which differ in peak wavelengths.

As shown in FIGS. 1A to 1D, the LED module 1a includes the lenses 4 that correspond one-to-one to the light sources 3. That is, each of the lenses 4 is configured to control distribution of light from a one-to-one corresponding light source 3. The LED module 1a can accordingly increase an optical output thereof.

In the embodiment, each lens 4 is made from acrylic resin. Each lens 4 has a form, an outer diameter of which becomes gradually larger towards the far end from the circuit substrate 2 along its own central axis. Each lens 4 also has an outer peripheral surface 45. A form of each lens 4 is axially symmetric around its own central axis (optical axis 4X). A light entrance surface 42 of each lens 4 has a first light entrance surface 421 that is an inner bottom of a corresponding hollow 40, and a second light entrance surface 422 that is an inner peripheral surface of the hollow 40. Each lens 4 includes a light exit surface 44 that allows light from a corresponding light entrance surface 42 to exit. The light exit surface 44 has: a first light exit surface 441 that allows light from a corresponding first light entrance surface 421 to exit; and a second light exit surface 442 that allows light, which is from a corresponding second light entrance surface 422 and then reflected by a corresponding outer peripheral surface 45, to exit. Preferably, the first light exit surface 441 is shaped like a convex surface. Preferably, the second light exit surface 442 is shaped like a flat surface. A periphery of the first light exit surface 441 in planar view is shaped like, e.g. a circle. The second light exit surface 442 is shaped like a ring surrounding the first light exit surface 441 in planar view. In each lens 4, a distance from the circuit substrate 2 to its own second light entrance surface 442 is longer than a distance from the circuit substrate 2 to its own first light exit surface 441. Each lens 4 has an annular face (non-lens surface) 443 that connects an outer periphery of its own first light exit surface 441 and an inner periphery of its own second light exit surface 442.

Each lens 4 has a function that allows light from its own first light entrance surface 421 to exit from its own first light exit surface 441, and a function that allows light from its own second light entrance surface 422 to be reflected (total reflected) by its own outer peripheral surface 45 to exit from its own second light exit surface 442.

In the embodiment, the LED module 1a includes a lens member 400 having the lenses 4. Preferably, the lens member 400 includes a front plate part 4011 apart from the surface 21 of the circuit substrate 2, and a side plate part 4012 shaped like a circular tube protruding from a periphery of the front plate part 4011 towards the circuit substrate 2. In short, it is preferable that the lens member 400 be shaped like a cylinder with a lid. The front plate part 4011 and the side plate part 4012 may be made from acrylic resin. In the lens member 400, the front plate part 4011 is integrally formed with the lenses 4. In short, the lens member 400 is made from acrylic resin. The lens member 400 is attached to the circuit substrate 2.

Figure 5:
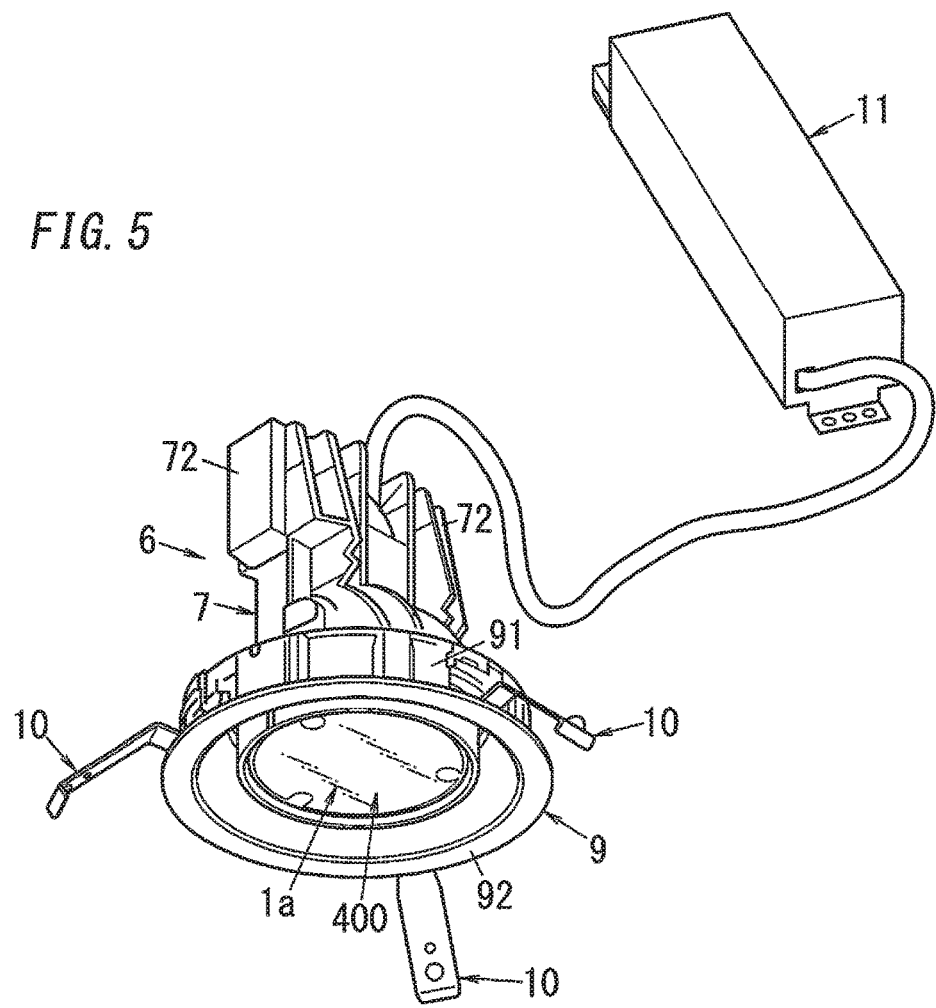
FIG. 5 is a schematic perspective view of a light fixture with the LED module.
Figure 6:
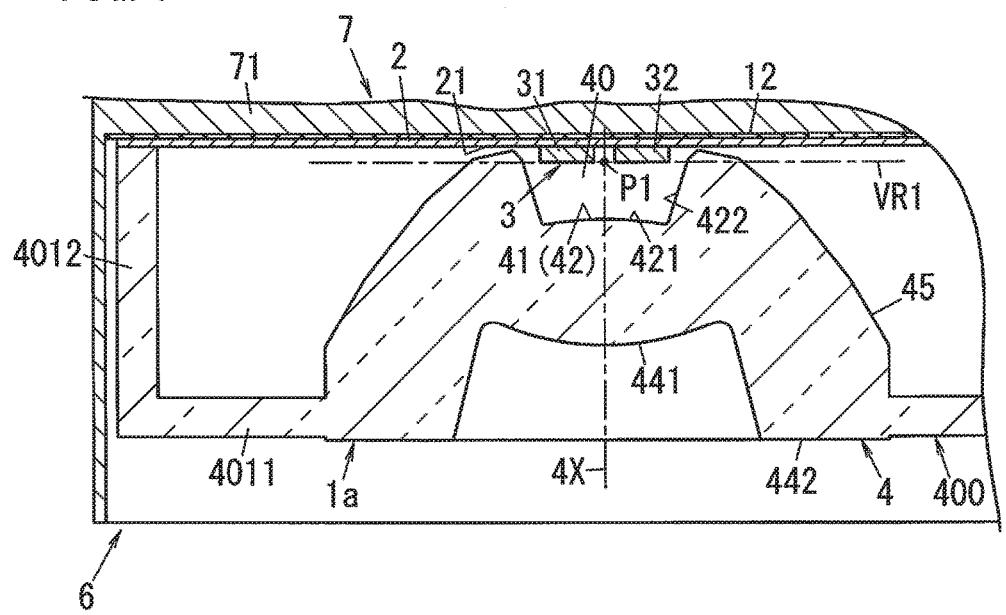
FIG. 6 is a schematic sectional view of part of the light fixture with the LED module.

A light fixture 6 with the above LED module 1a will be hereinafter explained with reference to FIGS. 5 and 6.

The light fixture 6 includes the LED module 1a, and a fixture body 7 that retains the LED module 1a. The light fixture 6 can accordingly suppress irregular colors thereof when respective light from first and second LEDs 31 and 32 that differ in chromaticity is mixed.

The light fixture 6 is, for example a ceiling recessed light fixture. Specifically, the light fixture 6 is a ceiling recessed downlight.

The light fixture 6 may include the fixture body 7, a mounting frame 9, a retainer that is attached to the mounting frame 9 and rotatably retains the fixture body 7, and three mounting springs 10 attached to the mounting frame 9.

In an example, the fixture body 7 is made of aluminum. The fixture body 7 may be made by aluminum die casting.

Preferably, the fixture body 7 integrally includes a base 71 (see FIG. 6) and radiation fins 72. The LED module 1a is provided in the base 71 of the light fixture 6. Preferably, the light fixture 6 further includes a heat conductive sheet 12 between the base 71 and the LED module 1a. The heat conductive sheet 12 is electrically non-conductive and has thermal conductivity. For example, the heat conductive sheet 12 is a silicone gel sheet that is electrically non-conductive and has thermal conductivity. As an example, the silicone gel sheet may be SARCON® or the like. Material of the heat conductive sheet is not limited to silicone gel, but may be, for example elastomer or the like that is electrically non-conductive and has thermal conductivity.

Since the light fixture 6 includes the heat conductive sheet 12 between the LED module 1a and the fixture body 7, heat generated by the LED module 1a can be transmitted to the fixture body 7 efficiently. The light fixture 6 can accordingly dissipate heat generated by the LED module 1a through the radiation fins 72 efficiently.

In an example, the mounting frame 9 is made of aluminum. The mounting frame 9 may be made by aluminum die casting. The mounting frame 9 includes a frame body 91 that is shaped like a hollow cylinder, and a flange 92 that protrudes outside from a lower end of the frame body 91. The periphery of the flange 92 is shaped like a circle. An outer diameter of the flange 92 is larger than that of the frame body 91.

In an example, each mounting spring 10 is made of stainless steel. Each mounting spring 10 is a plate spring. The three mounting springs 10 are apart from each other on the circumference of the frame body 91.

For example, the light fixture 6 is attached to a ceiling member with the mounting frame 9 and the three mounting springs 10. The ceiling member is formed with a mounting hole for attaching the light fixture 6 to. An inner diameter of the mounting hole is larger than the outer diameter of the frame body 91 and smaller than the outer diameter of the flange 92. In the installation of the light fixture 6, the mounting springs 10 are first elastically deformed along the fixture body 7 before the fixture body 7 is inserted into the mounting hole. The fixture body 7 and the mounting springs 10 are then inserted into the mounting hole so that the flange 92 comes into contact with a lower surface of the ceiling member. As a result, the mounting springs 10 come into contact with an upper surface of the ceiling member by respective spring force of the mounting springs 10. Thus, the light fixture 6 can hold the ceiling member with and between the mounting springs 10 and the flange 92. In other words, the light fixture 6 is recessed into the ceiling member.

Modified Example 1

Figure 7:
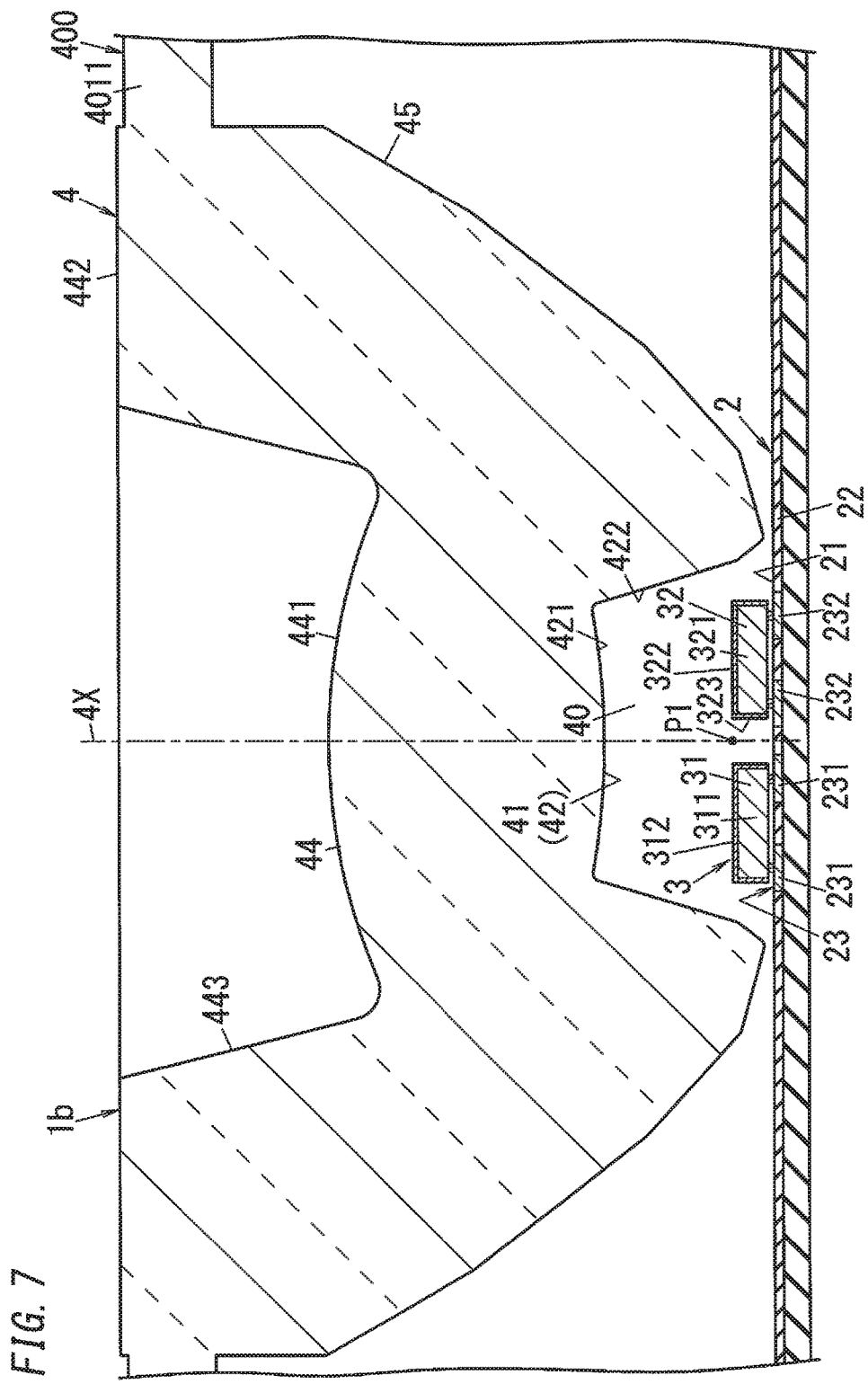
FIG. 7 is a schematic sectional view of part of an LED module in a first modified example in accordance with Embodiment 1.

FIG. 7 is a schematic sectional view of part of an LED module 1b in a first modified example in accordance with Embodiment 1. In the LED module 1b, identical constituent elements to those of the LED module 1a in Embodiment 1 have been allocated identical reference numerals, and description thereof has been omitted as appropriate.

The LED module 1b has the same basic configuration as the LED module 1a, and differs from the LED module 1a in that at least one of each periphery of first LEDs 31 and each periphery of second LEDs 32 (each periphery of the second LEDs 32 in the modified example) has light blocking effect. The LED module 1b can accordingly prevent respective light, from one of first wavelength conversion members 312 of first LEDs 31 and second wavelength conversion members 322 of second LEDs 32 in each light source 3, from directly entering the other. The LED module 1b accordingly facilitates designing respective chromaticity of the light sources 3.

Each first LED 31 includes a first LED chip 311 and a first wavelength conversion member 312. The first wavelength conversion member 312 coats a surface and sides of the first LED chip 311. A chip size package LED forming each first LED 31 has its own first wavelength conversion member 312 as a package.

Each second LED 32 includes a second LED chip 321 and a second wavelength conversion member 322. Each second LED 32 also includes a light blocking member 323. The second wavelength conversion member 322 coats a surface of the second LED chip 321, and the light blocking member 323 coats sides of the second LED chip 321 and sides of the second wavelength conversion member 322. A chip size package LED forming each second LED 32 has its own second wavelength conversion member 322 and light blocking member 323 as a package.

Preferably, each light blocking member 323 has light blocking effect by a function for reflecting light from corresponding second LED chips 321. It is accordingly possible to improve light-extraction efficiency in comparison with the case where a light blocking member 323 of each second LED 32 has light blocking effect by a function for absorbing light from corresponding second LED chips 321. Each light blocking member 323 is made from, for example silicone resin or the like containing titanium oxide, alumina or the like.

Modified Example 2

Figure 8:
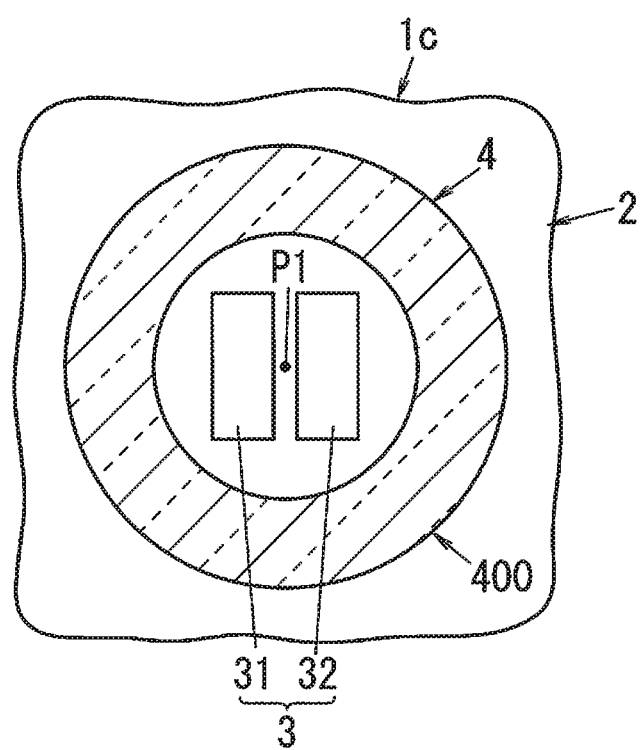
FIG. 8 is a cross sectional view of part of an LED module in a second modified example in accordance with Embodiment 1.

FIG. 8 is a cross sectional view of part of an LED module 1c in a second modified example in accordance with Embodiment 1. In the LED module 1c, identical constituent elements to those of the LED module 1a in Embodiment 1 have been allocated identical reference numerals, and description thereof has been omitted as appropriate.

In the LED module 1c, each of first and second LEDs 31 and 32 may have a shape of an oblong having four straight sides, two of which are longer than the other two, in planar view or be shaped like an oblong in planar view. In short, each of the first and second LEDs 31 and 32 has an oblong shape in planar view. Each of the first and second LEDs 31 and 32 also has an identical size. Each light source 3 includes first and second LEDs 31 and 32 one each. Thus, each light source 3 of the LED module 1c is formed of one first LED 31 and one second LED 32, and can thereby have a shape close to a point light source. As a result, it is possible to suppress irregular colors and reduction in efficiency of each lens 4.

Modified Example 3

Figure 9A:
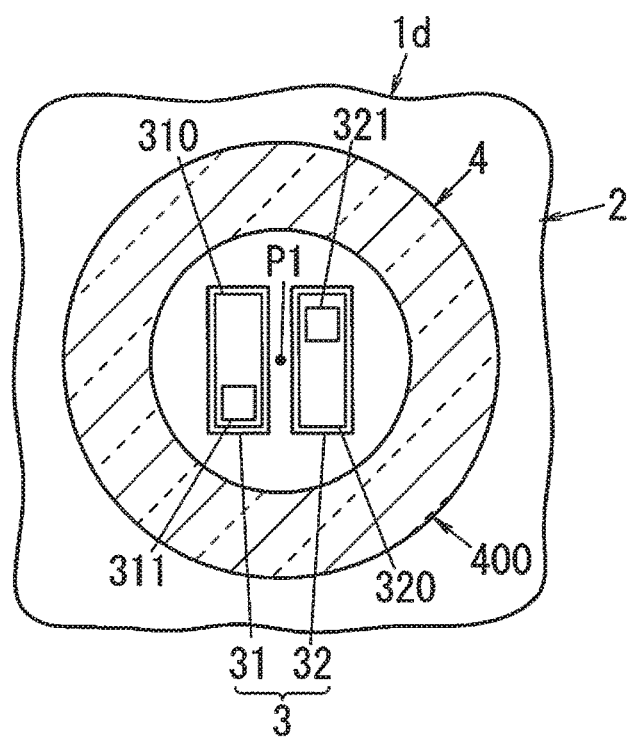
FIG. 9A is a cross sectional view of part of an LED module in a third modified example in accordance with Embodiment 1.

An LED module 1d in a third modified example in accordance with Embodiment 1 will be explained with reference to FIGS. 9A and 9B. The LED module 1d has almost the same configuration as the LED module 1c in the second modified example, and therefore identical constituent elements to those of the LED module 1c have been allocated identical reference numerals, and description thereof has been omitted as appropriate.

In the LED module 1d, each of first and second LEDs 31 and 32 is a surface-mount LED. Each first LED 31 has a first LED chip 311, and a first package 310 which houses the first LED chip 311 and in which the first LED chip 311 is placed at one end side of the first package 310 in a longer direction thereof. Each second LED 32 has a second LED chip 321, and a second package 320 which houses the second LED chip 321 and in which the second LED chip 321 is placed at one end side of the second package 320 in a longer direction thereof. The first LED chip 311 of a first LED 31 and the second LED chip 321 of a second LED 32 in each light source 3 are arranged around a center in a plane to have point symmetry. The plane is perpendicular to an optical axis 4X of a corresponding lens 4 (see FIG. 1D). The center is an intersection P1 of the optical axis 4X and the plane. The LED module 1d can accordingly suppress irregular colors thereof.

Each first package 310 includes a cathode terminal and an anode terminal. First LED chips 311 are each die-bonded to the cathode terminals of the first packages 310 and electrically connected with cathode electrodes of the first LED chips 311. The anode terminals of the first packages 310 are electrically connected with anode electrodes of the first LED chips 311 via wires. An anode terminal and a cathode terminal in each first package 310 are spaced out in a longer direction thereof.

Each second package 320 includes a cathode terminal and an anode terminal. Second LED chips 321 are each die-bonded to the cathode terminals of the second packages 320 and electrically connected with cathode electrodes of the second LED chips 321. The anode terminals of the second packages 320 are electrically connected with anode electrodes of the second LED chips 321 via wires. An anode terminal and a cathode terminal in each second package 320 are spaced out in a longer direction thereof.

Figure 9B:
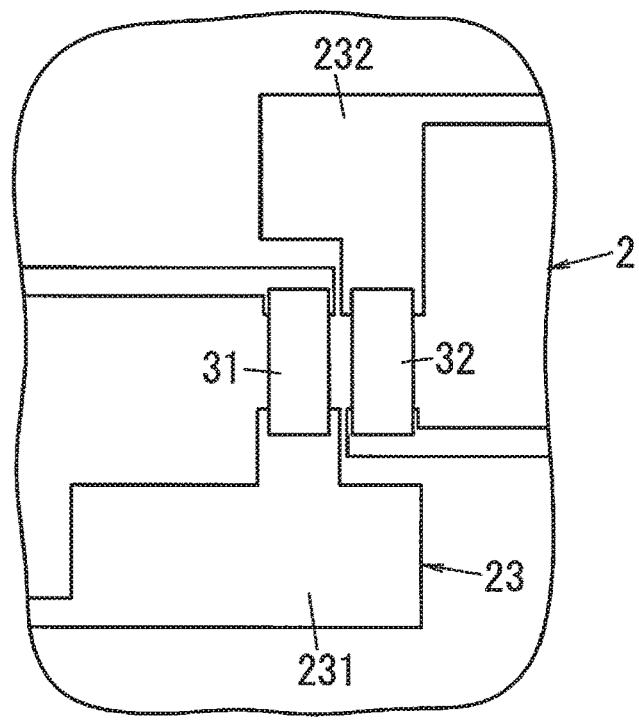
FIG. 9B is a schematic plan view of part of the LED module.

In the LED module 1d, as shown in FIG. 9B each area 231, 232 of conductors 23, connected with the cathode terminals of the first and second LEDs 31 and 32 is larger than each area thereof, connected with the anode terminals of the first and second LEDs 31 and 32. The LED module 1d can accordingly have improved heat dissipation capacity.

Embodiment 2

Figure 10:
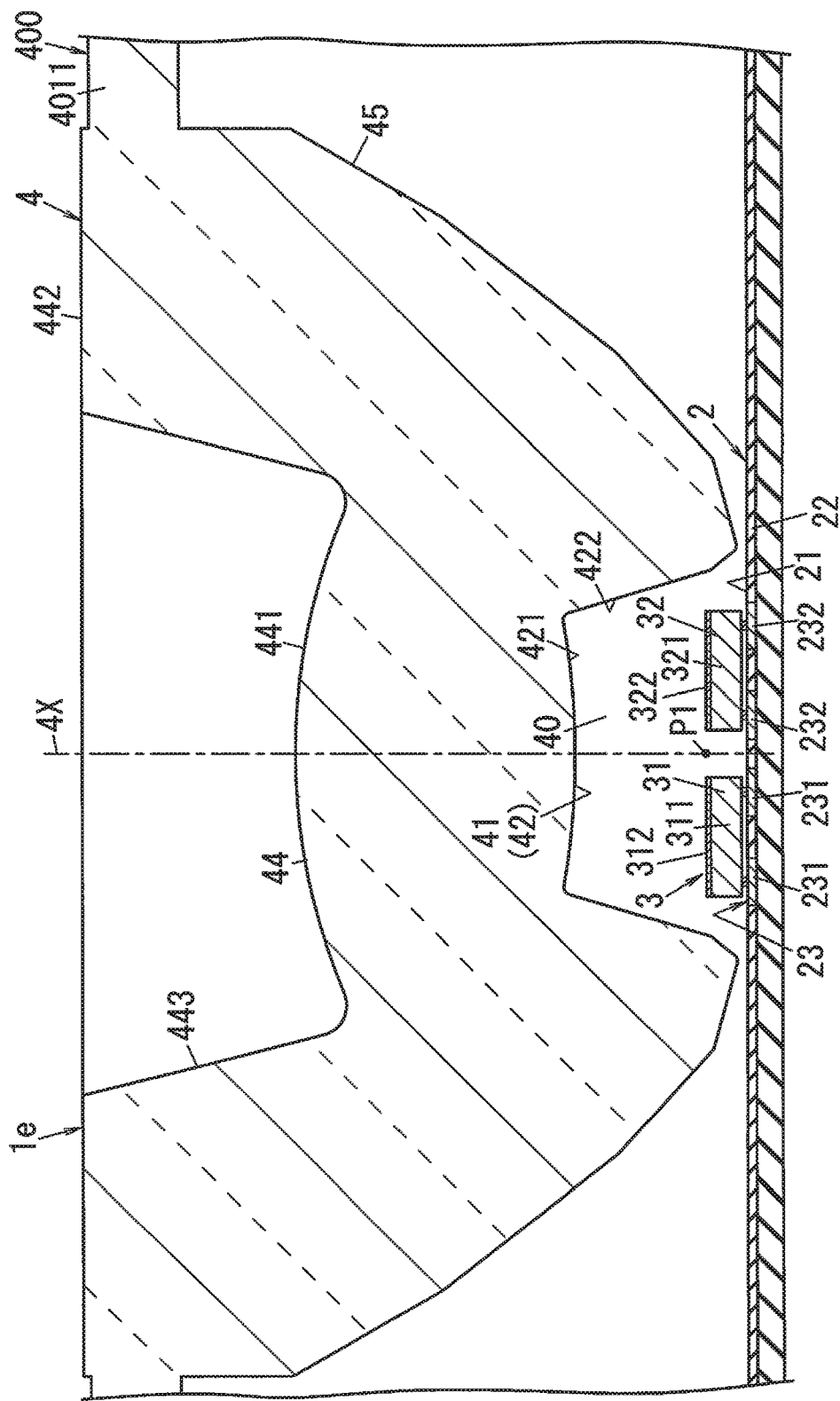
FIG. 10 is a schematic sectional view of part of an LED module in accordance with Embodiment 2.

An LED module 1e in accordance with Embodiment 2 will be hereinafter explained with reference to FIG. 10.

The LED module 1e of the embodiment has the same basic configuration as the LED module 1a in Embodiment 1. In the LED module 1e of the embodiment, each first LED 31 includes: a first LED chip 311 mounted on a surface 21 of a circuit substrate 2; and a first wavelength conversion member 312 disposed on a side of the surface 21 of the circuit substrate 2 to cover the first LED chip 311. Each second LED 32 includes: a second LED chip 321 mounted on the surface 21 of the circuit substrate 2; and a second wavelength conversion member 322 disposed on the side of the surface 21 of the circuit substrate 2 to cover the second LED chip 311. Each light source 3 of the LED module 1e can accordingly have a shape close to a point light source. As a result, the LED module 1e can further suppress irregular colors thereof and reduction in efficiency of each lens 4. In the LED module 1e, identical constituent elements to those of the LED module 1a have been allocated identical reference numerals, and description thereof has been omitted as appropriate.

The first LED chip 311 mounted on the surface 21 of the circuit substrate 2 means mechanical connection between the circuit substrate 2 and the first LED chip 311 on the surface 21 of the circuit substrate 2, and electrical connection between the first LED chip 311 and a corresponding conductor 23 of the circuit substrate 2. The second LED chip 321 mounted on the surface 21 of the circuit substrate 2 means mechanical connection between the circuit substrate 2 and the second LED chip 321 on the surface 21 of the circuit substrate 2, and electrical connection between the second LED chip 321 and a corresponding conductor 23 of the circuit substrate 2. In short, the LED module 1e of the embodiment is a COB (Chip On Board) LED module.

Each first wavelength conversion member 312 is formed on a surface of a corresponding first LED chip 311. Each second wavelength conversion member 322 is formed on a surface of a corresponding second LED chip 321. Preferably, each of the first and second wavelength conversion members 312 and 322 is formed by applying resin containing phosphor by, e.g. a dispenser system. The resin containing phosphor means optically-transparent resin (e.g., silicone resin) containing phosphor particles. Preferably, the dispenser system includes a controller configured to control a discharge amount of the resin containing phosphor from a nozzle. The dispenser system can therefore improve reproducibility of a shape obtained by applying the resin containing phosphor. The controller can be realized by installing an appropriate program on a microcomputer, for example.

Respective material, numerical values and the like in Embodiment 1, Modified Example 1, Modified Example 2, Modified Example 3 and Embodiment 2 are just preferable examples, and not intended to be limited thereto. It is intended by the following claims to claim any and all modifications and variations that fall within the true scope of the present teachings.

For example, the circuit substrate 2 is not limited to the circular shape in planar view, but may be shaped like, e.g. a rectangle or the like in planar view, where the rectangle means a right-angled quadrilateral. The printed-circuit board forming the circuit substrate 2 may also be, e.g. a metal-based printed circuit board.

For example, in the LED modules 1a to 1e, a color of each first LED 31 is a white color and a color of each second LED 32 is a light bulb color, but the color combination of each first LED 31 and each second LED 32 is not limited thereto.

Material of each lens 4 is not limited to acrylic resin, but may be, for example polycarbonate resin, silicone resin, glass or the like.

The light fixture 6 may include any one of the LED modules 1b to 1e instead of the LED module 1a.

The invention claimed is:

1. An LED module, comprising:
a circuit substrate;
a light source including first and second LEDs that differ in chromaticity, the light source being provided on a surface of the circuit substrate; and
a lens disposed on a side of the surface of the circuit substrate and configured to control distribution of light from the light source, the lens including a hollow, on a side of the circuit substrate, inside which the light source is present, wherein:
the circuit substrate is provided with conductors for driving the first and second LEDs independently,
an inside of the hollow is a light entrance surface, an opening of the hollow has a circular shape, the first and second LEDs are spaced apart from the light entrance surface of the hollow of the lens, a space exists between the first and second LEDs and the light entrance surface, and the first and second LEDs of the light source are point-symmetrically arranged with respect to a center of a plane, the plane being perpendicular to an optical axis of the lens, the center being an intersection of the optical axis and the plane.

2. The LED module of claim 1, wherein each of the first and second LEDs has an oblong shape in planar view, the first and second LEDs have an identical size, and the light source has the first and second LEDs one each.

3. The LED module of claim 1, wherein each of the first and second LEDs is a chip size package LED.

4. The LED module of claim 2, wherein the first LED is a surface-mount LED and includes a first LED chip and a first package which houses the first LED chip and in which the first LED chip is placed at one end side, in a longer direction, of the first package, the second LED is a surface-mount LED and includes a second LED chip and a second package which houses the second LED chip and in which the second LED chip is placed at one end side, in a longer direction, of the second package, and the first LED chip of the first LED and the second LED chip of the second LED are point-symmetrically arranged with respect to the center.

5. The LED module of claim 1, wherein each of the first and second LEDs has a square shape in planar view, the first and second LEDs have an identical size, and the light source has the first and second LEDs two each.

6. The LED module of claim 1, wherein at least one of respective peripheries of the first and second LEDs has light blocking effect.

7. The LED module of claim 1, wherein the first LED includes a first LED chip mounted on the surface of the circuit substrate and a first wavelength conversion member that is disposed on a side of the surface of the circuit substrate to cover the first LED chip, and the second LED includes a second LED chip mounted on the surface of the circuit substrate and a second wavelength conversion member that is disposed on the side of the surface of the circuit substrate to cover the second LED chip.

8. The LED module of claim 1, wherein a color of the first LED is a white color, and a color of the second LED is a light bulb color.

9. A light fixture, comprising:

the LED module of claim 1; and a fixture body that retains the LED module.

* * * * *